United States Patent [19]
Karam et al.

[11] Patent Number: 6,010,937
[45] Date of Patent: Jan. 4, 2000

[54] REDUCTION OF DISLOCATIONS IN A HETEROEPITAXIAL SEMICONDUCTOR STRUCTURE

[75] Inventors: Nasser H. Karam, Lexington; Steven J. Wojtczuk, Waltham, both of Mass.

[73] Assignee: Spire Corporation, Bedford, Mass.

[21] Appl. No.: 08/523,694

[22] Filed: Sep. 5, 1995

[51] Int. Cl.$^7$ .................................................. H01L 21/331
[52] U.S. Cl. ........................... 438/363; 438/413; 438/495
[58] Field of Search .................................... 438/798, 930, 438/935, 363, 413, 495; 117/95, 84, 104

[56] References Cited

U.S. PATENT DOCUMENTS

| | | | |
|---|---|---|---|
| 3,168,423 | 2/1965 | Krieglstein et al. | 148/175 |
| 3,729,348 | 4/1973 | Saul | 148/172 |
| 3,862,859 | 1/1975 | Ettenberg et al. | 117/215 |
| 3,893,876 | 7/1975 | Akai et al. | 148/175 |
| 3,962,716 | 6/1976 | Pétroff et al. | 357/18 |
| 3,963,538 | 6/1976 | Broadie et al. | 148/175 |
| 3,963,539 | 6/1976 | Kemlage et al. | 148/175 |
| 4,159,354 | 6/1979 | Milnes et al. | 427/74 |
| 4,246,050 | 1/1981 | Moon | 148/171 |
| 4,344,444 | 8/1982 | Miura | 131/201 |
| 4,370,510 | 1/1983 | Stirn | 136/262 |
| 4,434,025 | 2/1984 | Robillard | 156/601 |
| 4,507,169 | 3/1985 | Nogami | 156/606 |
| 4,561,916 | 12/1985 | Akiyama et al. | 148/175 |
| 4,588,451 | 5/1986 | Vernon | 148/175 |
| 4,591,654 | 5/1986 | Yamaguchi et al. | 136/252 |
| 4,632,710 | 12/1986 | Van Rees | 148/175 |
| 4,632,712 | 12/1986 | Fan et al. | 148/175 |
| 4,699,688 | 10/1987 | Shastry | 156/606 |
| 4,756,792 | 7/1988 | Fujita et al. | 156/610 |
| 4,771,017 | 9/1988 | Tobin et al. | 437/203 |
| 4,808,551 | 2/1989 | Mori et al. | 437/81 |
| 4,859,625 | 8/1989 | Matsumoto | 437/81 |
| 4,894,349 | 1/1990 | Saito et al. | 437/95 |
| 4,910,167 | 3/1990 | Lee et al. | 437/132 |
| 4,963,949 | 10/1990 | Wanlass et al. | 357/16 |
| 4,965,224 | 10/1990 | Horikawa et al. | 437/132 |
| 5,070,026 | 12/1991 | Greenwald et al. | 437/3 |
| 5,076,857 | 12/1991 | Nowlan | 136/256 |
| 5,091,333 | 2/1992 | Fan et al. | 437/82 |
| 5,116,455 | 5/1992 | Daly | 156/605 |
| 5,168,071 | 12/1992 | Fullowan et al. | 437/31 |
| 5,173,443 | 12/1992 | Biricik et al. | 438/559 |
| 5,231,298 | 7/1993 | Daly | 257/191 |
| 5,260,621 | 11/1993 | Little et al. | 310/303 |
| 5,322,573 | 6/1994 | Jain et al. | 136/252 |
| 5,399,206 | 3/1995 | De Lyon | 148/334 |
| 5,402,748 | 4/1995 | Takai et al. | 117/84 |
| 5,571,339 | 11/1996 | Ringel et al. | 136/252 |

FOREIGN PATENT DOCUMENTS

| | | |
|---|---|---|
| 0 291 346 | 11/1988 | European Pat. Off. . |
| 0 331 467 | 9/1989 | European Pat. Off. . |
| 2 627 013 | 4/1989 | France . |
| 2 647 957 | 12/1990 | France . |

OTHER PUBLICATIONS

R. H. Saul, "Reduced Dislocation Densities in Liquid Phase Epitaxy Layers by Intermittent Growth," *J. Electrochem. Soc.: Solid State Science*, 118:793–795 (May 1971).

B–Y. Tsaur et al., "Efficient GaAs/Ge/Si Solar Cells," IEEE, pp. 1143–1148 (1982).

P. Sheldon et al., "Dislocation Density Reduction Through Annihilation in Lattice–Mismatched Semiconductors Grown by Molecular–Beam Expitaxy," *J. Appl. Phys.*, 63:5609–5611 (Jun. 1988).

(List continued on next page.)

*Primary Examiner*—Charles Bowers
*Assistant Examiner*—Reneé R. Berry
*Attorney, Agent, or Firm*—Thomas J. Engellenner; Nutter, McClennen & Fish, LLP

[57] ABSTRACT

A heteroepitaxial semiconductor device having reduced density of threading dislocations and a process for forming such a device. According to one embodiment, the device includes a substrate which is heat treated to a temperature in excess of 1000° C., a film of arsenic formed on the substrate at a temperature between 800° C. and 840° C., a GaAs nucleation layer of less than 200 angstroms and formed at a temperature between about 350° C. and 450° C., and a plurality of stacked groups of layers of InP, wherein adjacent InP layers are formed at different temperatures.

36 Claims, 2 Drawing Sheets

OTHER PUBLICATIONS

S.J. Wojtczuk et al., "Development of InP Solar Cells on Inexpensive Si Wafers," 1st World Conference on Photovoltaic Energy, Waikoloa, Hawaii, 3 pages (Dec. 5–9, 1994).

M. Berklenblit et al., "Reduction of Stress in Single Crystal Hetero–Expitaxial Layers," *IBM Technical Disclosure Bulletin*, 12:1489 (Feb. 1970).

B.M. Kemlage, "Deposition of Gap Heteroepitaxy on Silicon, " *IBM Technical Disclosure Bulletin*, 18:1852 (Nov. 1975).

Weinberg, I. et al., "Recent Progress in InP Solar Cell Research," *Proceedings of the 26th Intersociety Energy Conversion Engineering Conference* , vol. 2, Boston, 327–333 (Aug. 4–9, 1991).

REDUCTION OF DISLOCATIONS IN A HETEROEPITAXIAL SEMICONDUCTOR STRUCTURE

BACKGROUND OD THE INVENTION

The present invention relates generally to reducing dislocations in semiconductor structures. More specifically, the invention is directed to processes for reducing dislocations in semiconductor layers formed on a dissimilar substrate. The invention is further directed to dislocation reduction in heteroepitaxial semiconductor structures (i.e. semiconductor layers of one material formed on a semiconductor layer of a different material).

Substrates (also called wafers) on which semiconductor devices can be fabricated can be formed from a variety of materials. By way of example, some substrates are formed from gallium arsenide (GaAs), while others are formed from indium phosphide (InP) or silicon (Si). Different substrate materials have different advantages and disadvantages. For example, substrates formed from GaAs and InP are relatively fragile, in relation to those formed from Si of the same thickness. Due to the fragility, GaAs and InP substrates need to be thicker than Si substrates to make fabrication practical. Because GaAs and InP substrates tend to be thicker and have a higher density than Si substrates, they are heavier than Si substrates having the same surface area. Additionally, Si substrates are much less expensive than GaAs or InP substrates.

As in the case of substrates, the semiconductor devices fabricated thereon can also be formed from a variety of materials. By way of example, both InP and GaAs are suited for fabrication of photovoltaic cells, also called solar cells when used with sunlight. InP and GaAs are also suited for fabrication of optoelectronic integrated circuits (OEIC), wherein optical devices, such as laser diodes and photodiodes, are fabricated together with semiconductor transistors on a common substrate. Such fabrication can entail depositing layers of epitaxial films (films having a predominately single crystallographic orientation) on dissimilar substrates. By this we mean that the epitaxial film can be one type of semiconductor, for example InP or GaAs, while the substrate wafer can be a different semiconductor, such as Si or germanium (Ge). Epitaxial films are sometimes referred to as epilayers, and formation of an epitaxial film on a dissimilar substrate is typically referred to as heteroepitaxy.

To take full advantage of particular unique properties of various materials, it is sometimes desirable to fabricate electronic devices and the substrate on which they are formed from dissimilar semiconductors. However, such heteroepitaxial fabrication poses significant difficulties, such as dislocations which can thread through adjacent layers, epitaxial layer cracking and surface roughness. These difficulties are caused predominantly by differences in the lattice constants and in the linear coefficients of thermal expansion of the dissimilar materials employed. For example, the lattice constant of Si (5.43 angstroms) differs from that of GaAs (5.65 angstroms) by approximately 4%, and the thermal expansion coefficient of Si ($3 \times 10^{-6\circ}$ C.$^{-1}$) differs from GaAs ($6 \times 10^{-6\circ}$ C.$^{-1}$) by a factor of two. Similarly, the lattice mismatch between InP (lattice constant of 5.87 angstroms) and Si is approximately 8% and the thermal expansion coefficient of InP ($5 \times 10^{-6\circ}$ C.$^{-1}$) differs from that of Si ($3 \times 10^{-6\circ}$ C.$^{-1}$) by a factor of about 1.7.

A variety of prior art processes exist for minimizing the density of dislocations in heteroepitaxial structures. One such prior art process forms an amorphous buffer layer between a substrate and an epitaxial layer of a dissimilar material. According to one example of this process, an amorphous GaAs buffer layer is formed on a Si substrate, followed by an amorphous InP layer and then an epitaxial InP layer. Since the GaAs buffer layer has a lattice constant intermediate between the lattice constants of the Si substrate and the InP layers, it serves to ease the transition between the substrate and the epitaxial layer.

Another prior art process for easing the transition between the substrate and the epitaxial layer of a dissimilar material lies in the use of a compositionally graded interface between the substrate and the epitaxial layer. Preferably, the graded interface is lattice matched to the substrate at one end and lattice matched to the material of the semiconductor device at an opposite end. The compositional grading is achieved by gradually adding or subtracting a component to a base substance as the graded interface is formed on the substrate, thus allowing a smooth compositional transition between the substrate material and the epitaxial layer material.

A further prior art process employs interrupted growth. According to this process, a plurality of epitaxial layers of a semiconductor composition are formed at an elevated temperature (for example, 700° C. in the case of InP epitaxy) on a dissimilar substrate. Following the formation of each layer, the substrate and previously formed layers are cooled. Due to lattice mismatch between the epitaxial layers and the substrate, initially a high concentration of dislocations exist. However, since the thermal expansion coefficients of the epitaxial layers and the substrate are different, the epitaxial layers are subjected to mechanical stresses during cooling. The mechanical stresses induce dislocation movement and cause the dislocations to form loops. The dislocation loops tend not to thread through to any subsequently formed layers.

Although prior art processes have achieved some success with regard to reducing threading dislocations in heteroepitaxial semiconductor structures, there is nevertheless room for improvement. Specifically, it is difficult to achieve reproducible results with prior art processes, thus rendering commercialization of heteroepitaxial semiconductor structures costly.

Accordingly, an object of the present invention is to provide an improved process for fabricating semiconductor epitaxial layers on dissimilar substrates.

A further object of the present invention is to reduce threading dislocations in heteroepitaxial semiconductor structures.

Another object of the present invention is to provide a process for reproducibly fabricating heteroepitaxial semiconductor structures having a reduced density of dislocations.

Other objects of the invention will in part be obvious and in part appear herein after.

SUMMARY OF THE INVENTION

The present invention provides an interface region of reduced dislocations between the substrate and devices fabricated on the substrate by forming a plurality of epitaxial layers by a process in which adjacent layers are deposited at different temperatures.

One preferred method for forming a dislocation reduced interface region, according to the present invention, includes the steps of providing a substrate of a first semiconductor material, and forming a plurality of stacked groups of layers of a second semiconductor material on the substrate, wherein adjacent layers included in each group are formed at different temperatures. Preferably, the temperature at which the layers in each group are formed defines a temperature profile, and the temperature profile repeats in each of the stacked groups. By way of example, the stacked groups can be stacked pairs. Each stacked pair includes a first layer of the second semiconductor material formed at a temperature in a first temperature range and a second layer of the second semiconductor material formed at a temperature in a second temperature range. The first and second layers are both preferably epitaxial, but can differ in thickness.

According to another embodiment of the invention, the stacked groups can be stacked triplets, quadruplets, quintuplets etc., wherein the temperature ranges in which the layers of each group are formed define a temperature profile. For example, in the case of a stacked triplet, the first, second and third layers can be formed at temperatures in first, second and third temperature ranges, respectively. Alternatively, the first and third layers can be formed at a temperature in a first temperature range and the second layer can be formed at a temperature in a second temperature range. Regardless of the number of layers in each group or the particular temperature profile employed, a feature of the present invention is that adjacent layers in each group are formed at different temperatures. According to one preferred embodiment which employs stacked pairs of InP layers, the first layer of each pair is formed at a temperature between about 575° C. and about 625° C. The second layer of each pair is formed at a temperature between about 650° C. and about 725° C.

In further embodiments of the invention, the stacked groups of layers can be formed from any periodic table group III-V compound, such as indium phosphide (InP) or indium gallium arsenide (InGaAs). Alternatively, the stacked groups of layers can be formed from a periodic table group II-VI compound, such as zinc selenide or cadmium telluride. It should be noted that wherever group III-V or group II-VI compounds are recited, also included are alloys thereof. In one preferred embodiment, stacked pairs of InP layers are formed on a Si substrate. Typically, the formation of an InP layer on a Si substrate results in the above discussed structural defects at the interface between the Si substrate and the InP layer. Dislocations caused by the structural defects tend to propagate or thread from one semiconductor layer to the next, thus enabling dislocations to propagate through a plurality of layers into the semiconductor device formed on the substrate.

However, by varying the temperature at which adjacent layers that make up a pair are formed, the invention reduces the number of dislocations that thread between the stacked groups. Consequently, dislocations from the substrate cannot readily propagate into a semiconductor device fabricated on top of the plurality of stacked groups.

According to one preferred embodiment of the invention, an InP photovoltaic cell is fabricated on an uppermost one of the plurality of stacked groups. The cell can include one or more p-type doped InP epitaxial layers and one or more n-type doped InP epitaxial layers. In one preferred construction, n-type layers are deposited on the p-type layers to form an "N-on-P" photovoltaic cell. The substrate can be fabricated, for example, from Si or Ge.

In a further embodiment of the invention, the layers of the stacked groups all have n-type doping to obviate the effects of the Si or Ge atoms diffusing out of the substrate into the epitaxial films. As a result, a rectifying junction can form between the lower p-type layers of the photovoltaic cell and the uppermost n-type layer of the stacked groups. To avoid the formation of a rectifying junction, according to one embodiment of the present invention, a tunnel junction is formed between the n-type stacked groups and the p-type bottom of the InP cell, creating a low resistance contact. The tunnel junction includes two semiconductor layers of opposite doping. In a preferred embodiment, a thin layer of n-type InGaAs is deposited on the uppermost stacked group, and a p-type InGaAs layer is deposited on this n-type InGaAs layer. The InP photovoltaic cell is then formed on this tunnel junction. The tunnel junction provides electrical contact to the photovoltaic cell from the grouped layers and substrate underneath the cell.

According to another embodiment, the invention provides a method for the epitaxial deposition of InP on Si by heat treating the substrate and forming a nucleation layer between the substrate and a lowermost stacked group. According to one particular embodiment, prior to depositing a first stacked group on a Si substrate, the substrate is heat treated to a temperature in excess of about 1000° C. to remove any oxide from the substrate. A nucleation layer of GaAs, preferably less than about 200 angstroms in thickness, can then be deposited on the substrate at a temperature of between about 350° C. and about 450° C. According to a further embodiment, a film of arsenic is formed between the Si substrate and the GaAs nucleation layer. Preferably, the arsenic film is formed at temperature between about 800° C. and about 840° C. and is only a few monolayers thick. The first layer of the first stacked group of layers can be formed on the GaAs nucleation layer. In the case of the formation of an InP photovoltaic cell, the first layer of the first stacked group can be an epitaxial InP film formed at a temperature between about 600° C. and about 775° C.

In this way the invention provides heteroepitaxial semiconductor structures having reduced density of dislocations and methods for forming such structures.

BRIEF DESCRIPTION OF THE DRAWINGS

For a fuller understanding of the nature and objects of the present invention, reference should be made to the following detailed description and the accompanying drawings, in which.

DETAILED DESCRIPTION OF THE DRAWINGS

As discussed above, the present invention is particularly directed to heteroepitaxial semiconductor structures having a reduced density of dislocations. Dislocations occur at the interface between dissimilar semiconductor materials due primarily to differences in thermal coefficients of expansion and lattice mismatches. Even though the dislocations initiate at the interface between heteroepitaxial materials, they can thread through multiple subsequent homogeneous layers.

Figure 1:
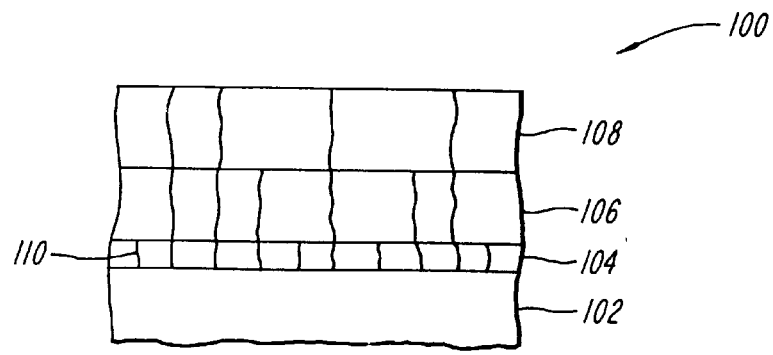
FIG. 1 shows a multilayer heteroepitaxial semiconductor structure having dislocations threading through a plurality of layers.

FIG. 1 shows a heteroepitaxial semiconductor structure 100 illustrative of the difficulties arising from threading dislocations. The structure 100 includes a silicon (Si) substrate 102, a gallium arsenide (GaAs) nucleation layer 104 and a pair of epitaxial indium phosphide (InP) layers 106 and 108. The GaAs nucleation layer 104 is employed as an intermediate layer between the Si substrate 102 and the epitaxial InP layer 104, because its lattice constant is intermediate between that of Si and InP. However, due to lattice mismatch, dislocations such as those shown at 110, nevertheless thread through the GaAs nucleation layer 104. Due to the additional lattice mismatch between GaAs and InP, a significant number of the dislocations 110 also thread through the InP epitaxial layer 106 into layer 108. As illustrated in layer 108, the dislocations 110 can continue to thread through additional homogeneous layers.

The present invention provides an intermediate region between a substrate fabricated from one semiconductor material and a device fabricated from another semiconductor material on the substrate. An intermediate region according to the invention impedes the threading of dislocations from the substrate to any device fabricated thereon.

Figure 2:
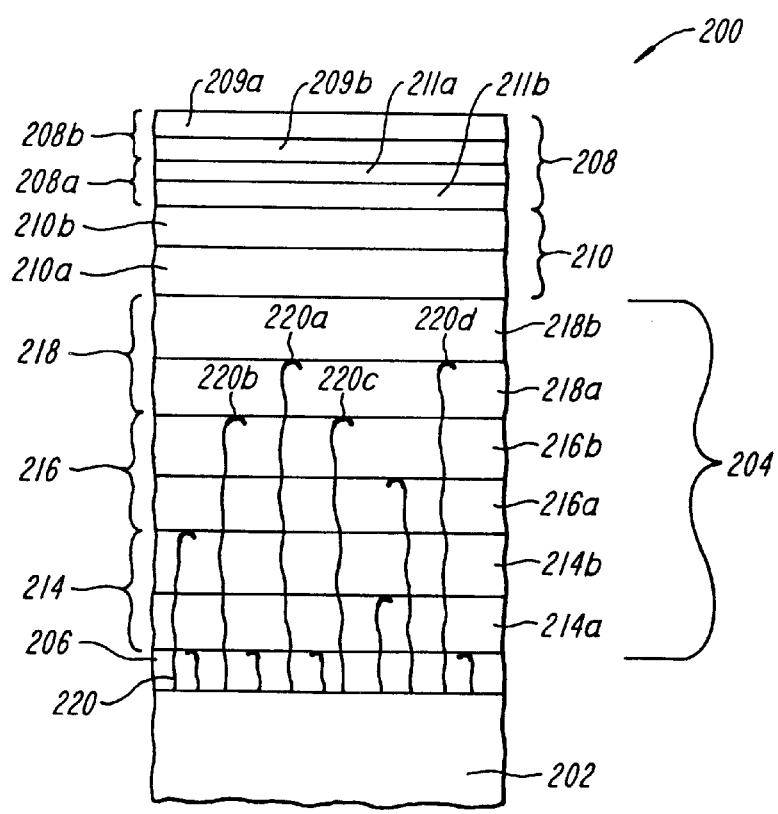
FIG. 2 shows a multilayer heteroepitaxial semiconductor structure fabricated in accord with the present invention.

FIG. 2 depicts a heteroepitaxial semiconductor structure 200 having an intermediate region 204, which is fabricated between a substrate 202 and a semiconductor device 208 in accord with the present invention. Optionally, the structure 200 can include a nucleation layer 206 formed between the substrate 202 and the intermediate region 204. A tunnel junction 210 for facilitating electrical contact to the device 208 can be formed between the device 208 and the intermediate region 204, or, in another embodiment of the invention, between a layer epitaxially grown on top of the nucleation layer 206 and the intermediate region 204.

In the depicted embodiment, the substrate 202 is Si. The semiconductor device 208 is an InP photovoltaic cell. Since the device 208 is fabricated from InP, the intermediate region 204 is preferably also fabricated from InP. However, any suitable periodic table group III-V or II-VI material, which is substantially lattice matched to the material of device 208, can be employed. Additionally, other substrate materials, such as germanium (Ge) and GaAs can be used. The optional nucleation layer 206 is preferably formed from GaAs. However, any semiconductor material having an intermediate lattice constant between the material of substrate 202 and the material of intermediate region 204 can be substituted in its place.

As in the case of the structure 100 of FIG. 1, dislocations 220 can thread from the substrate 202 through the nucleation layer 206. However, according to a preferred embodimet of the present invention, the intermediate region 204 is constructed to reduce the threading of the dislocations 220 to the device 208. More specifically, the intermediate region 204 of the depicted embodiment can be fabricated from a plurality of stacked groups 214–218 of InP layers. According to the illustrated embodiment, each stacked group 214–218 includes a first layer formed at a temperature in a first temperature range and a second layer formed at a temperature in a second temperature range. By way of example, group 214 has a first layer 214a and a second layer 214b; group 216 has a first layer 216a and a second layer 216b; and group 218 has a first layer 218a and a second layer 218b. Each of the layers 214a, 216a and 218a are formed at temperatures between about 575° C. and about 625° C. Alternatively, each of the layers 214b, 216b and 218b are formed at temperatures between about 650° C. and about 725° C. According to one embodiment, layers 214a, 216a and 218a are formed at substantially identical temperature, and layers 214b, 216b and 218b are formed at substantially identical temperature. According to another embodiment, adjacent layers of the stacked groups 214–218 can be fabricated from different, but closely lattice matched materials. For example, layers 214a and 214b can be formed from semiconductor materials having a lattice mismatch of less than 1000 ppm.

The inventors have discovered that varying the temperature at which adjacent layers in each group are formed generates a mechanical stress field at or near the interface of adjacent layers. As shown at 220a–220d, the stress field bends the dislocations at or near the interfaces and reduces the number of defects that thread through to subsequently formed groups of layers. While the illustrated embodiment depicts each group 214–218 as being a pair of layers, other structures such as stacked triplets, quadruplets, quintuplets etc. can be employed. However, regardless of the structure of the stacked groups, a feature of the present invention is that adjacent layers in each group are formed at different temperatures. A further feature of the present invention is that the temperature ranges in which the layers of each group are formed define a temperature profile, and the temperature profile repeats from group to group to form a thermally strained superlattice. For example, stacked triplets can be employed, wherein the temperatures at which the first, second and third layers of each triplet are formed are selected from first, second and third temperature ranges, respectively. Alternatively, the first and third layers of each triplet can be formed at temperatures selected from a first temperature range, while the second layer of each triplet is formed at temperatures selected from a second temperature range.

The inventors have further discovered that varying the thickness of adjacent layers can further enhance the intermediate region's effect on impeding threading dislocations. Thus, according to a further embodiment of the invention, adjacent layers of each group, such as layers 214a and 214b, are formed to have different thicknesses, and the different thicknesses at which the layers of each group are formed define a thickness profile, which like the temperature profile discussed above, repeats from group to group.

The number of stacked groups of layers required to substantially eliminate threading dislocations depends on several factors, including the lattice and thermal coefficient mismatch between the substrate 202 and the intermediate region 204, the thickness of the individual layers which make up the stacked groups and the temperature profile employed in fabricating the stacked groups. The depicted structure 200 employs three stacked pairs 214–218 of n-doped epitaxial layers of InP to substantially reduce threading dislocations 220 from reaching the device 208. According to one embodiment, each epitaxial layer of InP has a thickness of about 1 micron.

The InP and GaAs layers can be deposited by any epitaxial technique which provides high-quality semiconductor layers and p-n junctions. Preferably, metalorganic chemical vapor deposition (MOCVD) is used, but other techniques, such as molecular beam epitaxy (MBE) or liquid-phase epitaxy (LPE) can also be employed. In the illustrated embodiment of FIG. 2, the InP layers of groups 214–218 are formed by MOCVD using a ratio of phosphorous to indium of approximately 200. The GaAs layer 206 is formed from MOCVD using a gas ratio of arsenic to gallium of approximately 14.

Referring once again to FIG. 2, according to a preferred embodiment of the invention, an InP photovoltaic cell 208 is formed on the uppermost stacked group 218 of the intermediate region 204. The cell 208 can have several epitaxial layers, formed as two groups 208a and 208b, each of a different doping type. One group of layers 208a is p-type doped and the other group 208b is n-type doped. In a particular preferred construction, group 208a consists of two p-type InP layers 211a and 211b. The lower layer 211b (the back surface field of the solar cell) is doped with zinc to a concentration of about $3\times10^{18}$ cm$^{-3}$ and is about a half micron thick. The upper layer 211a (the solar cell base) is doped with zinc to a concentration of about $1\times10^{17}$ cm$^{-3}$ and is between about 3 microns and 5 microns thick. For the n-type layers 208b, the lower layer 209b (the emitter of the solar cell) is doped with Si or selenium to a concentration of about $3\times10^{19}$ cm$^{-3}$, with a thickness of 0.1 microns or less. There may also be an upper n-type layer 209a made of either InP or InGaAs that is even more heavily doped and which serves as a contact cap layer for the solar cell. This layer 209a is normally less than about one-half micron thick. If the layers of the intermediate region 204 are n-type, as in the depicted embodiment, a tunnel junction 210 is included to avoid the formation of a rectifying junction between the interface of the cell 208 and the intermediate region 204. The tunnel junction 210 includes two semiconductor layers 210a and 210b, having opposite doping and being about one-half micron thick. In the case where the layer 218b is n-type and layer 208a of the cell 208 is p-type, tunnel junction layer 210a is n-type doped with Si or Se to a concentration of greater than about $10^{19}$ cm$^{-3}$ and tunnel junction layer 210b is p-type doped with Zn to a concentration of greater than about $10^{19}$ cm$^{-3}$.

Although, the present invention can be used for fabrication of any heteroepitaxial semiconductor structures, an important motivation for its development arose generally from the field of photovoltaic cells (also called solar cells), and more specifically from the need for efficient photovoltaic cells for space applications. Photovoltaic cells for use in space applications require high power-to-weight ratios and strong resistance to radiation.

InP has generated considerable interest as a material for space photovoltaic cells, due to InP's inherent radiation resistance. However, InP cells fabricated on InP substrates suffer from two drawbacks in comparison with cells fabricated on Si substrates. The InP substrate cost is much higher and the physical fragility of InP requires a greater substrate thickness in order to make fabrication practical. The greater thickness results in increased mass and therefore, a lower power-to-weight ratio.

Fabricating InP photovoltaic cells on Si substrates is one promising approach to eliminating these drawbacks. Silicon substrates are much less expensive than InP substrates and are available in larger sizes. Additionally, the greater mechanical strength (which allows a thinner substrate wafer) and lower density of Si reduce cell mass, and increase the power-to-weight-ratio.

For photovoltaic cells operating in space, efficiency degradation due to bombardment by naturally occurring radiation is a major problem. Power conversion efficiency (conversion of sunlight into electrical power by the cell) tends to degrade faster for semiconductors having longer carrier lifetimes. For system engineering considerations, the end-of-life (EOL) efficiency is the figure used by aerospace designers. EOL efficiency is the value to which the efficiency is expected to degrade, after exposure to the amount of radiation calculated for the life of the mission in a particular orbit.

InP photovoltaic cells fabricated on InP substrates have a longer carrier lifetime and higher beginning-of-life (BOL) efficiency (before any irradiation, at the start of the space mission) than do InP cells fabricated on Si substrates, since the process of making the InP cells on Si wafers results in certain intrinsic defects, due the lattice constant and thermal expansion coefficient mismatch discussed previously. As a specific example, BOL efficiency for an InP cell on an InP substrate can be over 19%, while BOL efficiency for an InP cell on a Si substrate is about 13%.

The power conversion efficiency of InP cell on InP substrates initially degrades faster than does the efficiency of InP cells on Si wafers during early exposure to radiation. Finally, after a long time in a high radiation orbit (toward the end of the satellite mission), the EOL efficiencies tend to become similar for the two architectures, in one particular case about 10% for cells on both types of substrates. This similarity in efficiency between the InP cells on the two types of substrates is due to the fact that the radiation exposure and damage to both cells is similar, and that the degradation due to the radiation damage exceeds the degradation due to the defects in the InP cell on Si substrate that resulted from the mismatches in lattice constant and thermal expansion coefficients discussed previously. As a result, the InP cell on Si substrate provides a similar amount of EOL power compared to the InP cell on InP substrate, with an improved EOL power-to-weight ratio since the Si substrate wafer is only half as dense than the InP substrate, and, in addition, the Si substrate can be thinner since it is less fragile.

Through the use of an intermediate region fabricated in accordance with the present invention, dislocations that thread from the Si substrate to the InP cell can be substantially reduced. With a lower number of dislocations allowing a higher minority carrier lifetime, InP cells on Si substrates can be fabricated to have BOL efficiencies that approach the high BOL efficiencies of InP cells on InP wafers. The EOL efficiency for lower radiation orbits, such as the low earth orbits (LEO) and geosynchronous earth orbits (GEO) popular with many communication satellites will benefit from this improvement.

Dislocation reducing methods for heteroepitaxial structures according to the present invention enable InP cells on Si substrates to compete effectively with other standard solar cells in lower radiation orbits, in addition to the higher radiation orbits in which InP cells on Si substrates now show the greatest advantage.

Figure 3:
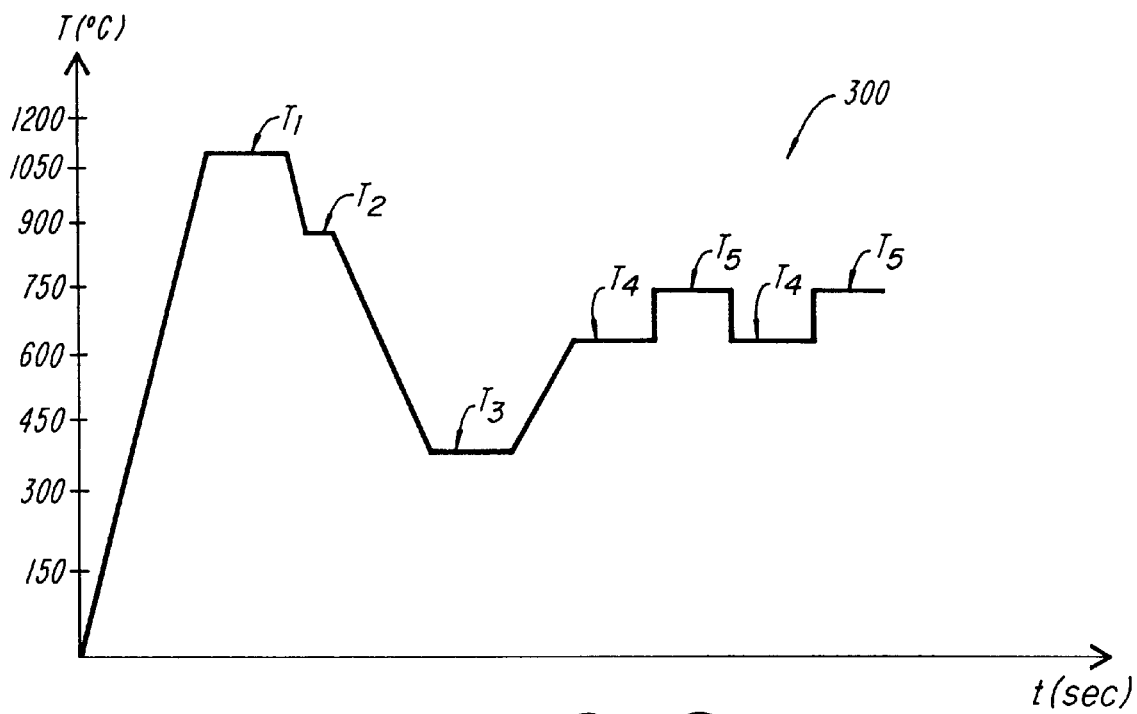
FIG. 3 is a graphical illustration of a multitemperature fabrication process for reducing threading dislocations.
Figure 4:
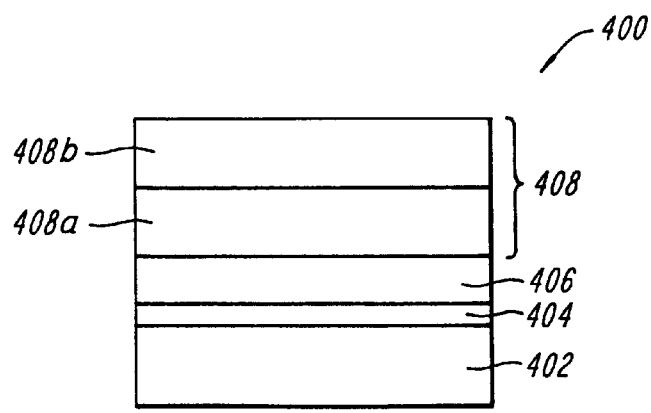
FIG. 4 shows a multilayer heteroepitaxial semiconductor structure fabricated in accord with the process of FIG. 3.

In an additional embodiment, the invention further reduces threading dislocations through a further temperature cycled process in which a very thin arsenic layer is formed to aid in the nucleation of the epilayers. FIG. 3 is a graphical representation 300 of such a further process according to the invention. FIG. 4 shows a heteroepitaxial structure 400 formed from the process of FIG. 3. Referring to FIGS. 3 and 4, a substrate 402 formed from a first semiconductor material, preferably Si, is heated to a first temperature T1 in excess of about 1000° C. Optionally, a prenucleation layer 404 of arsenic is then formed on the Si substrate 402 at a second temperature T2 in the range of about 800° C. to about 840° C. Preferably, the arsenic prenucleation layer 404 is less than about a few monolayers thick (i.e., approximately 5–10 angstroms). Next, a nucleation layer 406, similar in structure to nucleation layer 206 and preferably constructed from GaAs, is formed on the prenucleation layer 404. According to a preferred embodiment of the invention, the GaAs nucleation layer 406 is amorphous and is fabricated at a temperature T3 in the range of about 350° C. and about 450° C. Additionally, the nucleation layer 406 is preferably less than 200 angstroms thick. It can be formed from MOCVD with an arsenic to gallium gas ratio of 14. Optionally, the nucleation layer 406 can be formed directly on the substrate 402 and the prenucleation layer 404 can be omitted.

Following formation of the nucleation layer 406, an intermediate region 408, similar in construction to the intermediate region 204 of FIG. 2, can be fabricated thereon. By way of example, in the depicted embodiment, the intermediate region comprises one or more pairs of epitaxial layers of n-doped InP. Each pair includes a first layer 408a fabricated at a fourth temperature T4 in a range of about 575° C. to about 625° C. and a second layer 408b fabricated at a fifth temperature T5 in a range of about 650° C. to about 725° C. Once the dislocations have been sufficiently reduced by repeated pairs of temperature cycled intermediate layers, a semiconductor device, which is lattice matched to the intermediate region 408, can be formed thereon.

Other embodiments of the above described heteroepitaxial semiconductor structure and processes for forming such a structure will be obvious to those skilled in the art. Thus, additions, subtractions, deletions and other modifications of the preferred described embodiments are within the scope of the claims.

Having described the invention, what is claimed as new and secured by Letters Patent is:

1. A heteroepitaxial semiconductor device comprising:
   a substrate formed from a first semiconductor material;
   a plurality of stacked groups of layers of a second semiconductor material formed on said substrate, wherein adjacent layers within each group of layers are formed at different temperature ranges to induce mechanical stresses and, thereby, reduce dislocations.

2. A device according to claim 1 wherein said temperature ranges at which said layers in each group of layers are formed define a temperature profile, and said temperature profile repeats in each adjacent stacked groups of layers.

3. A device according to claim 1 wherein each said stacked groups includes a stacked pair of layers and wherein each of said stacked pairs of layers comprises a first epitaxial layer of said second semiconductor material having a first thickness and formed at a first temperature range, and a second epitaxial layer of said second semiconductor material having a second thickness and formed at a second temperature range.

4. A device according to claim 3 wherein said first temperature range and said second temperature range define a temperature profile within each of said stacked pairs, and said temperature profile repeats for each adjacent stacked pair of layers.

5. A device according to claim 3 wherein said first thickness and said second thickness define a thickness profile within each of said stacked pairs, and said thickness profile repeats for each adjacent stacked pair of layers.

6. A device according to claim 3 wherein said first temperature range is less than said second temperature range.

7. A device according to claim 3 wherein said first temperature range is greater than said second temperature range.

8. A device according to claim 3 wherein in said first thickness is substantially equal to said second thickness.

9. A device according to claim 3 wherein said first thickness is greater than said second thickness.

10. A device according to claim 3 wherein said first thickness is less than said second thickness.

11. A device according to claim 3 wherein said first temperature range is between about 575° C. and about 625° C.

12. A device according to claim 3 wherein said second temperature range is between about 650° C. and about 725° C.

13. A device according to claim 1 further comprising an epitaxial semiconductor device formed on an uppermost one of said stacked groups of layers.

14. A device according to claim 13 wherein said epitaxial semiconductor device comprises a photovoltaic cell.

15. A device according to claim 14 wherein said photovoltaic cell comprises,
   a p-type doped layer of a semiconductor compound formed on said uppermost stacked group; and
   an n-type doped layer of said semiconductor compound formed on said p-type doped layer;
   wherein said semiconductor compound is selected from periodic table group III-V and group II-VI compounds.

16. A device according to claim 14 further comprising a tunnel junction formed between said photovoltaic cell and said substrate.

17. A device according to claim 16 wherein said tunnel junction comprises,
   a first layer of InGaAs having a selected doping type and formed on said uppermost stacked group of layers; and
   a second layer of InGaAs having a doping type opposite to said first doping type and formed on said first layer of InGaAs.

18. A device according to claim 16 wherein said tunnel junction comprises,
   an n-type doped layer of InGaAs formed on said uppermost stacked group of layers; and
   a p-type doped layer of InGaAs formed on said n-type doped layer of InGaAs.

19. A device according to claim 14 wherein said photovoltaic cell comprises,
   a first epitaxial layer of InP having a first doping type and formed on said uppermost stacked group of layers; and
   a second substantially single crystal layer of InP having a doping type opposite to said first doping type and formed on said first epitaxial layer of InP.

20. A device according to claim 1 wherein said plurality of stacked groups of layers comprises a plurality of stacked groups of epitaxial layers of a semiconductor compound, and said device further comprises a photovoltaic cell having at least one further layer of said semiconductor compound, wherein said semiconductor compound is selected from periodic table group III-V and group II-VI compounds.

21. A device according to claim 1 wherein said plurality of stacked groups of layers comprises a plurality of stacked groups of epitaxial layers of a semiconductor compound, wherein said semiconductor compound is selected from periodic table group III-V and group II-VI compounds.

22. A device according to claim 21 wherein said epitaxial layers have the same doping type.

23. A device according to claim 21 wherein said semiconductor compound is InP.

24. A device according to claim 23 wherein said first and second epitaxial layers have the same doping type.

25. A device according to claim 1 wherein said plurality of stacked groups of layers comprises a plurality of stacked groups of epitaxial layers of a group II-VI compound.

26. A device according to claim 1 wherein said substrate is Si.

27. A device according to claim 1 further comprising a nucleation layer formed between said substrate and a first one of said stacked groups of layers.

28. A device according to claim 27 wherein said nucleation layer is formed from GaAs.

29. A device according to claim 27 wherein said nucleation layer has a thickness of less than about 200 angstroms.

30. A device according to claim 27 wherein said substrate is heat treated at a temperature in excess of about 1000° C.

31. A device according to claim 27 further comprising a film of arsenic formed between said nucleation layer and said substrate.

32. A device according to claim 31 wherein said film of arsenic is formed at a temperature between about 800° C. and about 840° C.

33. A device according to claim 27 wherein said nucleation layer comprises a GaAs layer of less than about 200 angstroms.

34. A device according to claim 33 wherein said nucleation layer is formed on said substrate at a temperature between about 350° C. and about 450° C.

35. A device according to claim 27 wherein said substrate is heat treated to a temperature in excess of about 1000° C., and wherein said nucleation layer comprises a GaAs layer of less than about 200 angstroms formed at a temperature between about 350° C. and about 450° C., said device further comprising a film of arsenic formed between said nucleation layer and said substrate at a temperature between about 800° C. and about 840° C.

36. A device according to claim 23 wherein said substrate is a Si substrate.

* * * * *